(12) United States Patent
Kiguta

(10) Patent No.: US 12,392,824 B2
(45) Date of Patent: Aug. 19, 2025

(54) SYSTEM, APPARATUS AND METHOD FOR COMMUNICATING DEBUG MESSAGES ON A SIDEBAND OF A SERIAL LINK ACCORDING TO A DEBUG TYPE MESSAGING PROTOCOL

(71) Applicant: Intel Corporation, Santa Clara, CA (US)

(72) Inventor: Nicholas M. Kiguta, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 676 days.

(21) Appl. No.: 17/513,049

(22) Filed: Oct. 28, 2021

(65) Prior Publication Data

US 2022/0050139 A1    Feb. 17, 2022

(51) Int. Cl.
  *G06F 11/00*     (2006.01)
  *G01R 31/3177*   (2006.01)
  *G06F 13/42*     (2006.01)

(52) U.S. Cl.
  CPC ..... *G01R 31/3177* (2013.01); *G06F 13/4282* (2013.01)

(58) Field of Classification Search
  CPC ............. G06F 11/0745; G06F 11/3648; G06F 11/3656
  See application file for complete search history.

(56) References Cited

U.S. PATENT DOCUMENTS

| | | | |
|---|---|---|---|
| 2015/0363293 A1* | 12/2015 | Pathirane ............ | G06F 11/3636 714/38.1 |
| 2016/0259005 A1* | 9/2016 | Menon ................... | G06F 11/364 |
| 2016/0358669 A1* | 12/2016 | Keshava ................ | G11C 29/38 |
| 2016/0358670 A1* | 12/2016 | Son ......................... | G06F 21/64 |
| 2017/0235701 A1* | 8/2017 | Pethe .................. | G06F 13/4286 710/313 |
| 2018/0188322 A1* | 7/2018 | Rogel-Favila ... | G01R 31/31725 |
| 2019/0114218 A1* | 4/2019 | Yun ..................... | G06F 11/0784 |
| 2021/0389371 A1* | 12/2021 | Liew ................ | G01R 31/31705 |
| 2022/0050139 A1* | 2/2022 | Kiguta ................ | G06F 11/0778 |

* cited by examiner

*Primary Examiner* — Philip Guyton
(74) *Attorney, Agent, or Firm* — Eversheds Sutherland (US) LLP

(57) ABSTRACT

In one embodiment, a method includes: in response to identifying an error in a device of a computing environment coupled to a host system of the computing environment via a serial link, sending, from a requester, a debug type messaging (DTM) request towards the device via a sideband portion of the serial link, the requester in-situ to the computing environment; and receiving, in the requester, a DTM response to the DTM request, the DTM response including status information of the device, via the sideband portion of the serial link. Other embodiments are described and claimed.

17 Claims, 8 Drawing Sheets

SYSTEM, APPARATUS AND METHOD FOR COMMUNICATING DEBUG MESSAGES ON A SIDEBAND OF A SERIAL LINK ACCORDING TO A DEBUG TYPE MESSAGING PROTOCOL

BACKGROUND

Serial links such as Universal Serial Bus 4 (USB4) and Thunderbolt (TBT3), can suffer link and intellectual property (IP) failures that can be difficult to debug, especially for solutions that use discrete components. For hard link failures, there is often a need to re-work a customer board to expose Joint Test Action Group (JTAG) pins that are then used to interact with the failing component. The survivability of this re-work is often less than 100%, which compounds the problem. For other types of failures that are not link related, using a primary interface to debug a faulty IP can introduce enough perturbation to distort the failing signature so that it either does not reproduce or the rate of failure is significantly altered. USB4/TBT3 logic analyzers can be useful in analyzing protocol failures between functioning components, but do little to root-cause hard failures in which no traffic is flowing. Thus current debug techniques for serial links have drawbacks.

DETAILED DESCRIPTION

In various embodiments, a debug type messaging (DTM) protocol is used that can be used to communicate via a sideband channel of a serial link. In this way, embodiments may make use of an existing low speed signaling protocol to tackle debug issues. In addition, DTM communications may occur in-situ such that one can probe the faulting device at all levels, without the need to change the failing environment by entering a special debug mode. In this way, a debugging interface is provided that does not perturb the primary traffic interface, and accesses any component without entering a special debug mode.

The Thunderbolt/USB4 sideband channel is an out-of-band serial signaling bus used for exchanging information about the link between two or more agents. The transactions that enable this are sent over the SBTX wire and received over the SBRX wire. Current implementations define the following transactions: Link Type (LT); Administrative Type (AT); and Re-timer Type (RT). Embodiments provide a Debug Type (DT) Messaging (henceforth called DTM) for communication via this existing sideband interface to realize a simple, transaction-oriented (e.g., simple query-response protocols that are suitable for debug use-cases), state-less, best effort-delivery protocol that can be used to debug all failures (Link and IP failures) across a Thunderbolt or USB4 link. DTM may be state-less since participating agents (e.g., Routers and Re-timers) need not implement logic to keep record of the state, since all transactions are simple, with well-defined delivery semantics, obviating a need for state recording. Note that embodiments may provide DTM as a best-effort delivery protocol that has no requirements on re-transmission of lost payloads. Retransmission can be built on top of DTM but the protocol itself imposes no such restrictions.

Embodiments may leverage software or firmware that runs on a Debug and Test System (DTS) (which can be a standalone DTS, or logic of a given device or component within a system) to place queries on the sideband link to a Target System (TS). The target system sends responses to such queries back to the DTS. The component within the TS that accepts, processes, and responds to requests is referred to as a Link Manager or Link Controller that may be configured to accept, process, and respond to DTM requests. For the rest of this document, the Link Manager/Controller is synonymous with a target system and is implicitly addressed. An agent can be, e.g., a Router or Re-timer that is connected to another router/re-timer and forms part of the Thunderbolt or USB4 topology. An Intellectual Property (IP) is a hardware unit that accomplishes a particular function or set of functions. A component is an IP within an agent that provides a specific I/O function. Examples include Display, PCIe, USB3 etc.

Figure 1A:
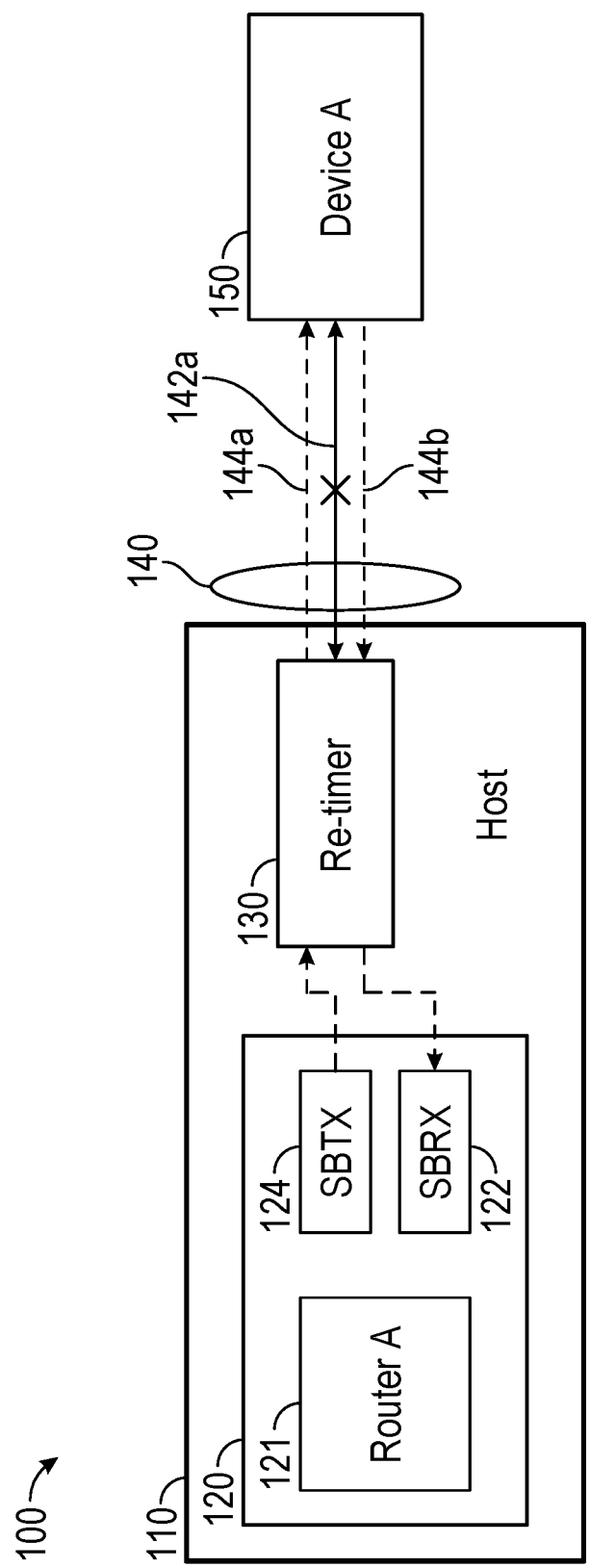
FIG. 1A is a block diagram of a computing environment in accordance with an embodiment.

Referring now to FIG. 1A, shown is block diagram of a computing environment in accordance with an embodiment. As shown in FIG. 1A, computing environment 100 includes a host system 110. In various embodiments, host system 110 may be a personal computer such as a desktop computer, portable computer, tablet computer or so forth. Of course, in other implementations, the host system may be another type of computing platform, including but not limited to server systems, embedded systems or so forth. As shown, host system 110 couples to a device 150 (Device A) via a link 140. As one example, device 150 may be implemented as a docking station or other device in communication with host system 110. In the embodiment of FIG. 1, link 140 may be implemented as a serial link, e.g., a USB4 or Thunderbolt link having a main link 142 and a sideband link 144a,b, namely a corresponding transmit and receive pair.

While many components of host system 110 are not illustrated, including a host processor such as a central processing unit (CPU) or other system-on-chip (SoC), memory, storage such as a non-volatile memory and so forth, an interface circuit 120 is illustrated. As shown, interface circuit 120 may be a serial bus interface that includes a router 121 and corresponding sideband receive and transmit circuits (respectively 122, 124). In turn, interface circuit 120 couples to a re-timer 130 that in turn communicates with device 150 via serial link 140.

In the illustration of FIG. 1A, sideband link 144 provides sideband point-to-point connectivity between two agents, and is depicted with dashed arrows. Link 142a may be implemented as a USB4 or Thunderbolt High Speed 10 link, and will be referred to as the main link, primary link or simply link without the qualifier. It is depicted with a solid arrow.

Unlike the other sideband transactions which only permit sideband register space access, DTM transactions allows access to components (and their registers spaces) within the participating agents (e.g., Routers and Re-timers) on the link, with well-defined structured queries for determining the components in the agents. It does not specify a security policy, leaving that to the implementer. However, for effective debug, an implementation of a software/firmware switch in the agent may allow varying levels of openness, to permit full access to the debugger based on a balance between need and the design phase of the implementation.

Note that with embodiments, any agent in a topology can initiate transactions (DTS bus mastering) and there are no provisions for refusing a transaction from a TS agent. In FIG. 1A, the main link between the host router 121 and Device A is not up, and it is desired to determine what went wrong in this case. Note that since the link is not functional, running a software-based debugger on the host 110 that uses the primary link is not an option.

Since Device A is connected to the first hop from the host 110, there are usually platform components on the host that enable debugging this scenario. On a closed system where these platform components are missing, the usual way is to hook a logic analyzer between the host and Device A. However, logic analyzers tend to be expensive and may not always be readily available or convenient to use. In the absence of a logic analyzer, some rework may be required on the host system to enable platform level debug hooks for effectively debugging this scenario, which is not preferable to rework a failing platform since the risk of losing the platform (and consequently the failure reproduction) is high. DTM works well in this scenario. Queries from the host re-timer or the host router can be placed to Device A through the sideband interface without needing any rework or expensive equipment to effectively determine the cause of failure.

Figure 1B:
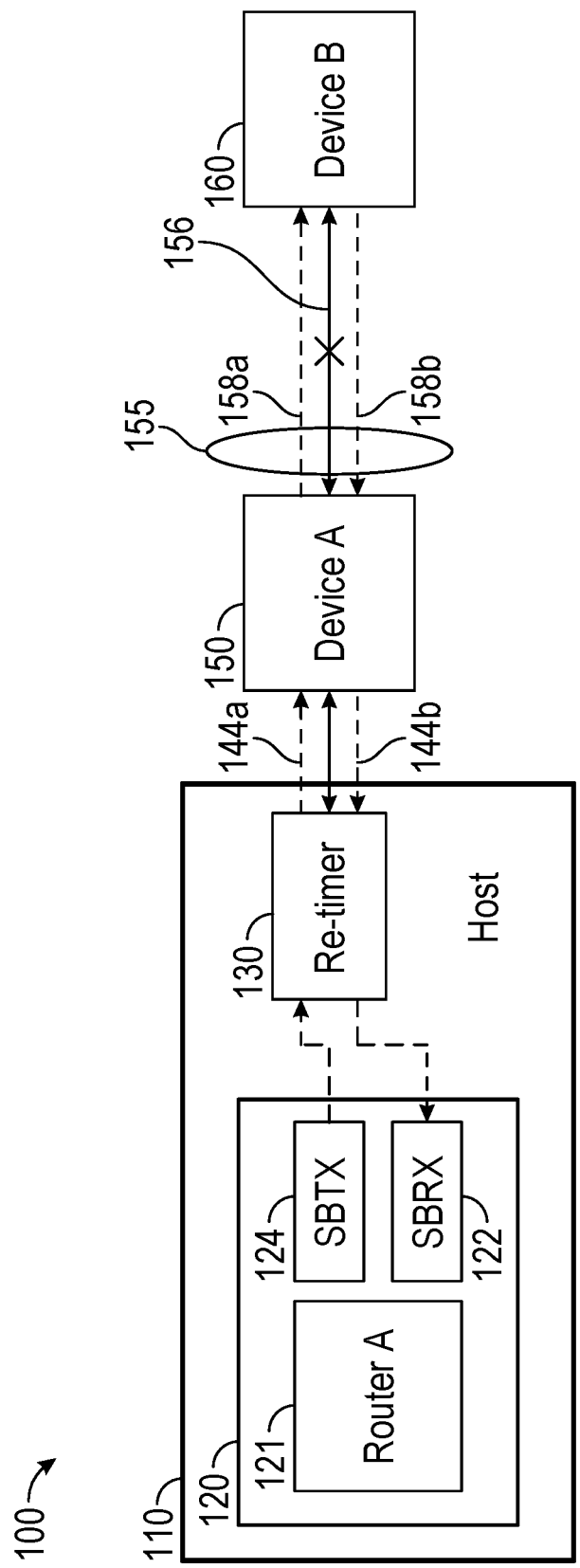
FIG. 1B is a block diagram of a computing environment in accordance with another embodiment.

Referring now to FIG. 1B, shown is block diagram of a computing environment in accordance with another embodiment. Note that like numbered elements are the same as in FIG. 1A. As illustrated in this arrangement, an additional agent or device 160 (Device B) couples to device 150 via another serial link 155 including a main link 156 and sideband link 158*a,b*.

In this arrangement, Device A successfully trained and is functional. After Device B is attached, the link does not successfully train, rendering Device B inoperable. While FIG. 1B shows the failing device on the second hop in the link, it could occur further down the link, e.g., up to a 6th hop. As discussed above, existing debug techniques may be undesirable in this situation. With embodiments, a DTM-based debugging may be convenient and readily available, e.g., to probe Device B's registers to find out what went wrong.

Referring now to FIG. 10, shown is a block diagram of a computing environment in accordance with another embodiment. Note that like numbered elements are the same as in FIGS. 1A and 1B. As illustrated in this configuration of a computing environment, an additional agent is present, namely a display 180, which couples to device 160 via yet another link 170. In this arrangement, a different class of failure is shown, in which the main links are active and functional but there is a failing IP on an agent (e.g., Display 180).

For this type of failure, since the links are fully functional, a conventional software-based debugger is used that runs on the host to read (and write) any registers in the failing agent. In the case of a display IP failure, this can be combined with an analyzer that captures Extended Display Identification Data (EDID) information to review the failure from the configuration (if any).

However, embodiments may provide a more elegant solution. With a DTM-based debugging as the delivery protocol, the failing IP in the agent can mirror the configuration and EDID packets (e.g., for Display 180) onto the DTM channel (bus), specifying a destination e.g., Router A, thus capturing all traffic between the failing agent and the monitor. With this in place, the failure can be quickly resolved, as this solution is readily accessible and does not require any expensive equipment to sniff the bus (EDID captures). Implementations can support re-direction or mirroring the output to both the DTM channel and internal busses. This kind of mirroring can be used to debug classes of problems in real time and is currently not available or feasible with the existing solutions. This is a preferable debug approach because it does not perturb the normal timing of regular internal flows.

Figure 1C:
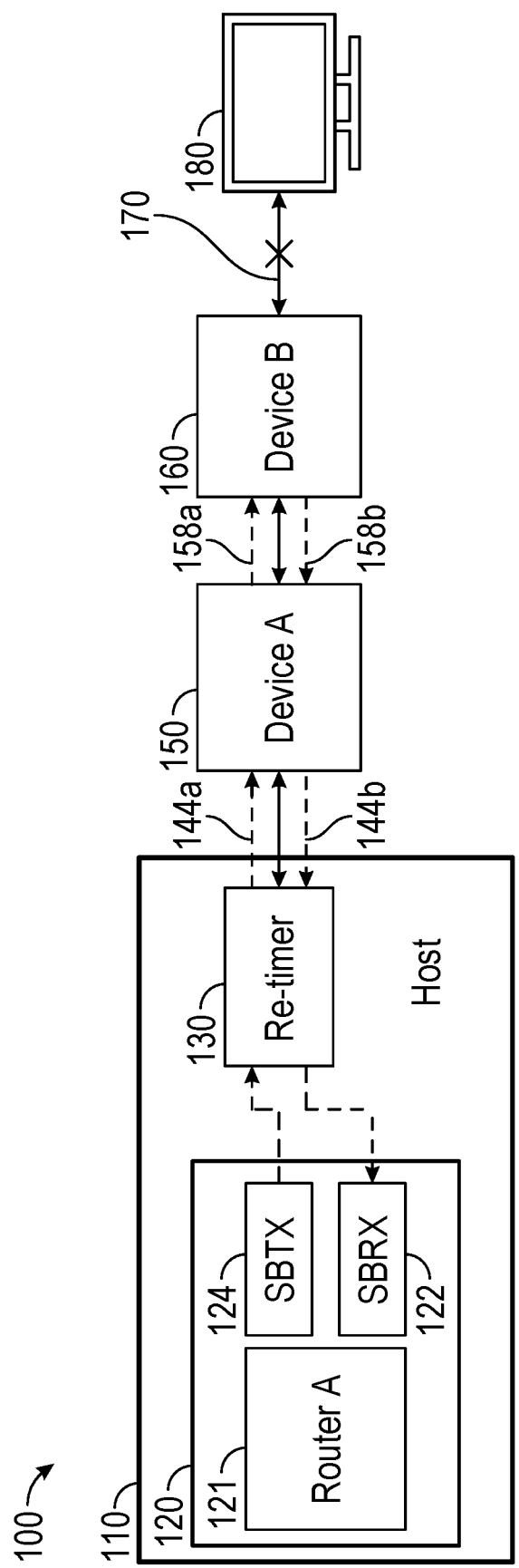
FIG. 1C is a block diagram of a computing environment in accordance with another embodiment.

In FIGS. 1A-1C, the host assumes the role of the DTS, but note that DTM allows any agent (e.g., host or re-timers) to be the DTS and does not limit this role to the host.

Figure 2:
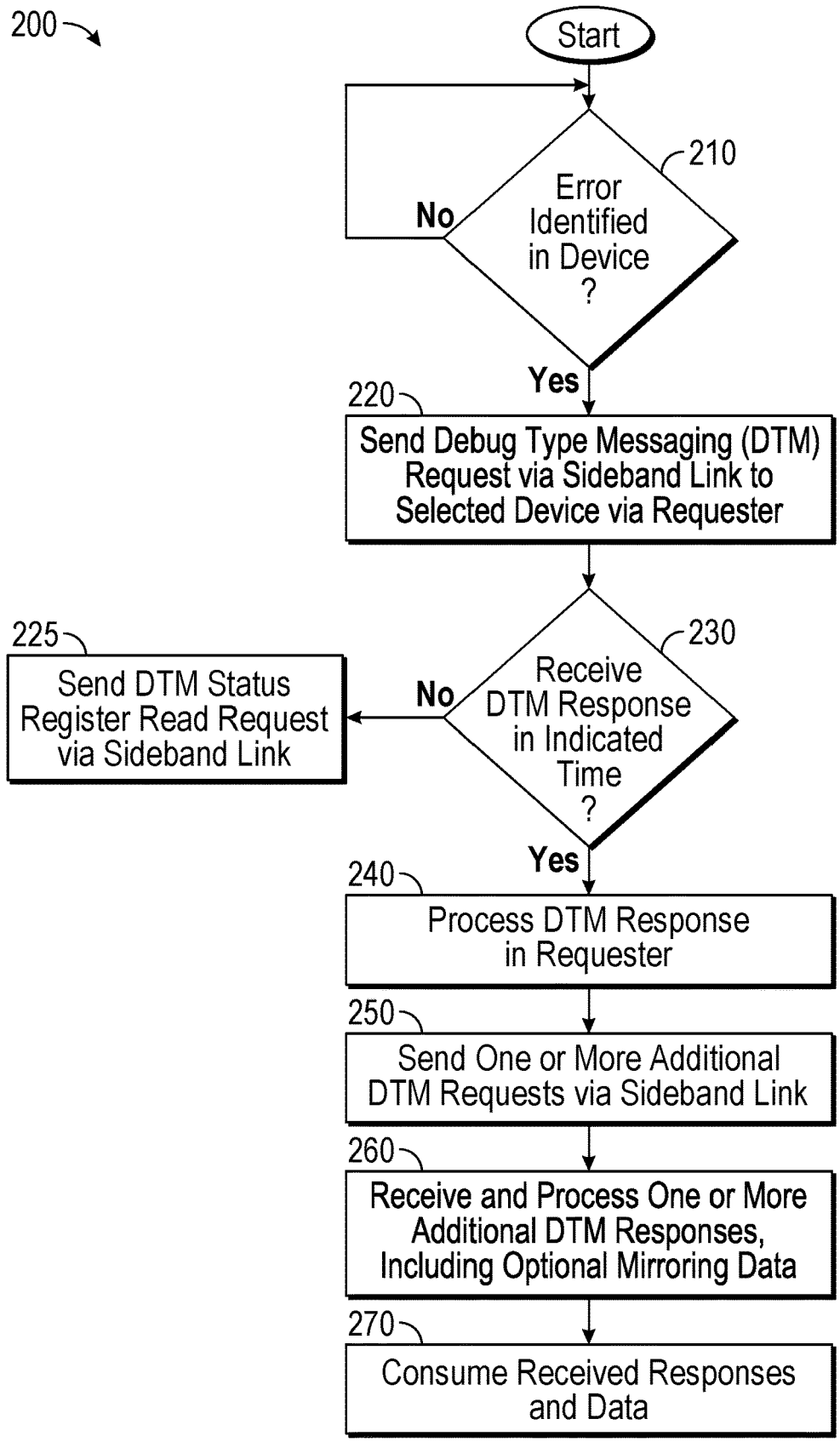
FIG. 2 is a flow diagram of a method in accordance with an embodiment.

Referring now to FIG. 2, shown is a flow diagram of a method in accordance with an embodiment. As shown in FIG. 2, method 200 is a method for initiating in-situ non-invasive debug by a debug initiator. Understand that in embodiments herein this debug initiator may not be a conventional DTS, but instead may be part of a host system or device coupled to the host system via one or more serial links. As such, this initiator may include hardware circuitry to execute method 200, e.g., in response to instructions stored in a non-transitory storage medium such as a debugger program to perform the non-invasive in-situ debugging according to a DTM protocol.

As illustrated, method 200 begins by determining that an error is identified in a device (block 210). For purposes of example, assume that a main link between the device and the host system is not working properly. In this case, control passes to block 220 where a DTM request is sent via a sideband link to this device. Such requests may be a query for information of one or more components included in the device, such as a link controller. Next it is determined at diamond 230 whether a DTM response has been received within an indicated time, e.g., a request completion time. If not, at block 225 a DTM status register read request may be sent via the sideband link to determine status indicated in the status register.

Still referring to FIG. 2, otherwise control passes to block 240 where the DTM response may be processed in the requester. Depending upon the information obtained, sufficient information may be present such that the information can be consumed to perform debugging. However in many cases, additional DTM requests may be also sent as shown at block 250. At block 260, additional DTM responses may be received and processed. Note that some of these requests and the incoming responses may be for mirroring data such as when it is desired to obtain information communicated between the device and possibly another device coupled to it to understand if an error is present in that connection. Finally at block 270, the received responses may be consumed, including any mirroring data received. This information may be consumed directly by the debugger and/or can be provided on a display to enable a user such as a debug engineer to identify issues present. Understand while shown at this high level in FIG. 2, many variations and alternatives are possible.

Figure 3:
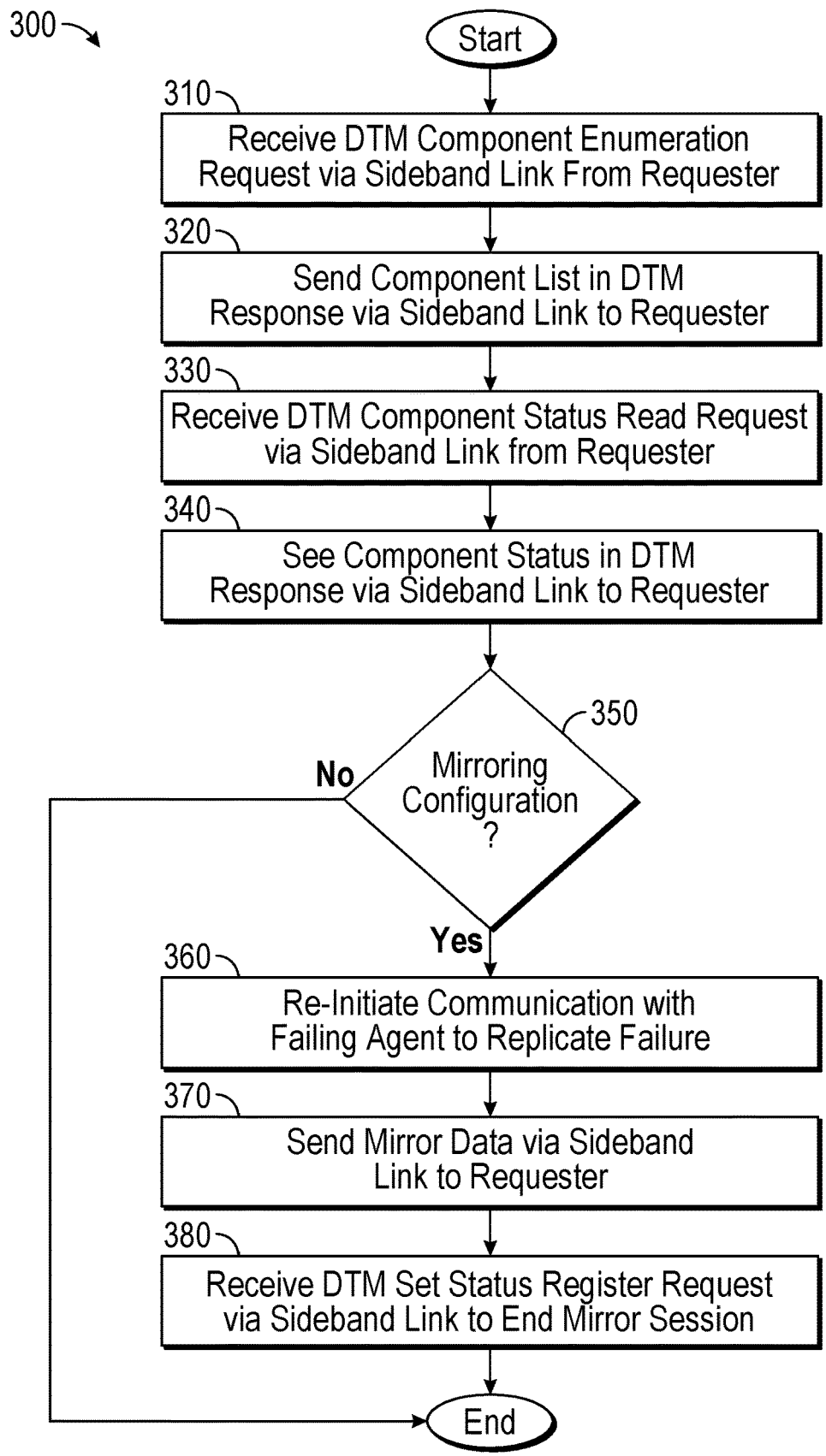
FIG. 3 is a flow diagram of a method in accordance with another embodiment.

Referring now to FIG. 3, shown is a flow diagram of a method in accordance with another embodiment. As shown in FIG. 3, method 300 is a method for communicating between a responder and a debug initiator. At block 310, a DTM component enumeration request may be received via the sideband link from the requester. In response to this request, at block 320 the device may send a component list in a DTM response via the sideband link to the requester. Note that in some cases, e.g., for security purposes, an enumeration of less than all included components may occur. Next at block 330, a DTM component status read request may be received via the sideband link from the requester. At block 340 the component status may be sent in a DTM response via the sideband link back to the requester. For example, one or more registers of a register space of the component may be read and the information sent back in this response.

Still referring to FIG. 3, it is also possible in cases for mirroring to occur as discussed above. As such it may be determined at diamond 350 whether a mirroring configuration has been arranged. In an example, such mirroring may be set up by way of a status register write and providing the status register value back to the requester to confirm proper configuration for mirroring.

In this situation, control passes to block 360 where communication with a failing agent may be re-initiated to replicate the failure. For example, a user may re-attach a link that couples, e.g., a display to this responding device. Then at block 370 the communications between the device and the failing agent, e.g., as communicated via a sideband link between these components, may be sent as mirror data back to the requester via the sideband link. Finally, at the conclusion of such mirroring, the device may receive a DTM set status register request via the sideband link, which causes the mirroring session to end (block 380). Understand while shown with this particular level of detail in FIG. 3, not all of the requests described above may occur in any particular debug situation.

Thus in embodiments a DTM protocol uses the sideband bus for transactions. Since this bus is used for other non-DTM traffic, debug traffic may be minimized as much as possible for the other uses. With this goal, DTM does not require that acknowledgement responses (ACK's) be sent to each request, to reduce bus utilization. Since acknowledgement packets are used to confirm a successful request transmission, DTM instead opts to implement a status register (in each device complying with the protocol) that can be read to determine the status of the responder. In practice, reads to the status register are not required with each request and may only be used when responses are not received after a specified time duration (tReqCompletion) has expired.

Debug use cases tend to be interactive and in keeping with the state-less requirement of DTM, no assumption is made about an agent's receive or response buffer space. It is assumed that agents respond to requests without buffering them. DTM supports a GetID transaction whose response is a unique agent ID, thus allowing the debugger to confirm that a response came from the intended agent.

DTM is defined by a simple core, relegating auxiliary responsibilities on the debugger to simplify its implementation. In one embodiment, a DTM protocol may be characterized by the following rules:
1. Transactions can originate from either a Router or Re-time, as bus mastering from re-timers may be useful for debugging new re-timer implementations.
2. Transactions target a destination agent (TS or Responder) from an originating agent (DTS or Sender).
3. Write transactions are posted transactions with no indication of successful transmission. Erroneous write requests are silently dropped and an indication of this is recorded in the status register. If there is a need to ensure that Writes are successful, a read of the status register may be performed with each Write (to check for errors). This trade-off is acceptable since typical debug scenarios tend to consume data (Read) more than produce data (Write).
4. Responses to read transactions are either the requested payload, an unsupported transaction indication or a WaitDuration message, which specifies a duration in milliseconds to wait for the response (tWaitDuration). This latter message is for requests that the TS (responder) deems would take longer than tReqCompletion to complete. It is the debugger's responsibility to resend the request after tWaitDuration units of time. This keeps DTM state-less.
5. Because transactions can originate from any agent, transactions are hop-based. The destination agent is specified relative to the sender and not from a global enumeration list. This allows changes in the link to be dynamic without re-enumerating the agents. This also simplifies the architectural implementation. Note that this implies the debugger is responsible for enumerating the agents on the link.
6. An index field value specifies a zero-based hop distance relative to the DTS. A direction bit determines the direction of requests (upstream/downstream): requests with the direction bit set are routed upstream (to the Host/CPU), while requests with the direction bit cleared are routed downstream (away from the Host/CPU).
7. The responding agent sends responses in the order of transaction receipt.
8. Split transactions are allowed, though not to the same agent. The DTS can target multiple agents in succession prior to any responses being sent back. Since state is not preserved by the agents, multiple requests to the same agent are not allowed, such that back-to-back requests to the same target are not allowed and are separated by responses.
9. Agents implement a 32-bit status register (also referred to as a debug status register) which can be read to determine the status of the agent and/or the last request received. Read requests to this register must complete. With this register in place, agents do not need to send ACKs back to requesters. This frees up the bus for other traffic.
10. Request transactions can be re-sent if no response is received after a given duration (e.g., 1 second) (tReqCompletion). The agents do not keep track of this time, the debugger does. Note that this is an interactive scenario. In practice, this shouldn't be an issue since the debugger knows if a request hasn't been responded to and can re-send the initial request. The status register may be read if a response has not been received within tReqCompletion prior to re-sending the request.
11. On the rare occasion that a target link manager is down, then no response will be sent for a request. The debugger can determine this by issuing a GetID request to an agent (either downstream or upstream) which is one hop away from the intended target. This request will not complete since the request goes through the offline agent. The lack of a completion to this request (combined with the target status register read not completing) indicates the target agent is down.
12. After receiving a request, a TS agent sets a busy bit in the status register and proceeds to complete the request. Any incoming request can be dropped while the busy bit is set. The exception to this rule is a status register read request which is responded to.

13. A TS agent can decline requests (e.g., for security reasons) by responding with an Unsupported Request message (the status register is an exception).
14. Each DTM payload includes a 16-bit CRC, broken up over two bytes (high and low CRC). Only the STX and Data symbols are used in the CRC calculation. This matches how other sideband transactions operate.
15. Response subtractive decoding is supported by dropping the transaction. If an agent receives a response to which no prior request was sent (Response index field is 0 though no previous request was sent), it can silently drop the response.
16. All other rules that govern sideband transactions also apply to DTM, to the extent there is no conflict between the above rules and existing rules.
17. Agents implement a 16-bit register (virtual or physical) that holds the version number of DTM to which the agent adheres. This value is returned in response to a GetDTMVersion read request.

The above rules constitute the core of the DTM protocol in accordance with an embodiment.

DTM's packet structure is similar to an Addressed RT Transaction sideband packet structure. Symbols within a transaction are sent in ascending order and the bits within the symbols are sent from bit 0 through bit 7. Given the nature of debugging use-cases, there are a few differences particularly around the number of data symbols allowed and target agent references.

Table 1 below shows the format of DTM transactions.

TABLE 1

Table 1. Debug Type Messaging (DTM) Transaction Format

| Byte | Payload Value | Description |
|---|---|---|
| 0 | 0xFE | Data Link Escape (DLE) Symbol - indicates the beginning of a transaction. |
| 1 | See Table 2 | Start Transaction (STX) Symbol - defines the operation of the transaction. |
| [n + 1:2] | See Table 3 | Data Symbols. Shall not exceed 127 Bytes. |
| n + 2 | Low-order byte | Low CRC (LCRC) Symbol. of 16-bit CRC |
| n + 3 | High-order byte of 16-bit CRC | High CRC (HCRC) Symbol. |
| n + 4 | 0xFE | Data Link Escape (DLE) Symbol. |
| n + 5 | 0x40 | End of Transaction (ETX) Symbol. |

The Start Transaction (STX) Symbol for DTM deviates slightly from the Addressed RT Transaction and is described below in Table 2.

TABLE 2

Table 2. STX Symbol for a DebugTyoe Messaging (DTM) Transaction.

| Bits | Name | Function |
|---|---|---|
| [7:6] | StartDT | Identifies this as a DT transaction. Shall be set to 11b. |
| [5] | Direction | Specifies the direction of the transaction. 0 - Downstream, 1 - Upstream. |
| [4:1] | Index | Zero-based index of the target agent. An agent that receives a request with this field set to 0 is the target agent and must respond. |
| [0] | CmdNotResp | Identifies if the request is a command (request) or response. Set to 0b for a response and 1b for a command. |

The index field specifies the target of the transaction. For each hop in the link, an agent checks if the value of the index field is 0 which would indicate it is the target of the transaction. If it is not, the agent subtracts 1 from this field and resends the request along the direction specified by bit 5 (direction), either upstream or downstream.

Consider a topology in which Devices 1-3 are serially connected. Suppose Device 3 issues a read request to Device 1. In this case, the direction bit would be 0x1 (since Device 1 is upstream of the Sender) and the index field would also be set to 0x1.

Upon receiving the incoming transaction, Device 2 would check that the index field is not 0x0, subtract 1 from the value and resend the transaction upstream. Device 1 would receive the incoming transaction, and since the index field specifies the value 0x0, it would claim the transaction and process the response. Downstream requests are constructed similarly, with the only change being that the direction bit is cleared (0) in the STX symbol.

The Data Symbol format of the Debug Type Messaging transaction is shown in Table 3. It also differs slightly from the Addressed RT Command Data Symbol. The key differences are that DTM supports addressing more registers (16-bit vs 8-bit) and encodes the sender index field for responses.

TABLE 3

Table 3. Debug Type Messaging Command Data Symbols.

| Symbol | Bits | Name | Function |
|---|---|---|---|
| [1:0] | 15:0 | REG | 16-bit address of the register being read from or written to. |
| 2 | [6:0] | LEN | Number of bytes to read/write. Shall not exceed 122. |
| 2 | [7] | WnR | 0b for a Read Request. 1b for a Write Request. |
| 3 | [3:0] | SrcIndex | Zero-based index of the Sender. Used by the responding agent to specify the target of the response. |
| 3 | [5:4] | Rsvd | |
| 3 | [6] | CompIdx Valid | If set, the ComponentIdx field is valid. |
| 3 | [7] | EOM | Last payload. Optional for Read requests. |
| 4 | [3:0] | ComponentIdx | Specifies the index of the component to access. |
| 4 | [7:4] | Rsvd/MirrorCfg | Reserved/Mirror configuration. |
| [m:5] | 7:0 | Command_Data | Only applies to Writes. A sequence of up to 122 bytes to be written. Contents appear least significant byte first. |

The 16-bit REG field doubles the addressable range used in the Addressed RT transactions for two reasons: to anticipate future needs in which more complex IP's with more than 256 registers may be integrated; and for some IP's, the address of a register within a block is constructed from a series of bit shifts (to prevent address aliasing). The 16-bit register field allows this to be specified by the debugger.

The LEN field specifies the number of bytes to read or write. A length field of zero is useful for when the DTS has no knowledge of how many items can be returned by the TS.

Each request includes a SrcIndex field which is the hop-based index of the requester (DTS) relative to the responding agent (TS). Note that this value is the same value specified in the index field of the STX payload due to the topological symmetry.

Continuing with the above discussion, assume Device 1 has completed the request and wants to send the response back to the Sender (Device 3). Since the STX index field is changed by each agent along the path, the information about the DTS (requester) is lost and the responder (TS) has no way of specifying the response target. The SrcIndex field of the DTM Data Symbol encodes this information. The responder obtains this information from the request and uses it to specify the response target.

The ComponentIdx field specifies the index of the component to access within an agent. DTM supports a GetComponentEnumeration transaction which returns a list of the components within it. It is up to the responding agent (based on a security-based policy) to determine how much of the enumeration is returned. The enumeration returns a table of tuples composed of an index (zero-based) and a short string that identifies the components within the responding agent. The last such payload from the enumeration response or any write response has the EOM field set to indicate the end of the response.

The Command_Data field only applies to Writes and includes up to 122 bytes of data to be written.

The Mirror field (symbol 4, bits 7:4) is used when mirroring has been enabled. For Writes, this field is reserved and is set to 0x0. For mirrored responses, this field encodes the same value that is used when setting up mirroring in the Status register.

It is possible to use DTM to access the sideband register space of a Router or Re-timer. When forming the transaction, simply omit the ComponentIdx. However, to specify that Symbol 4 is not a valid component index, clear bit 6 (CompIdxValid) and the Command_Data starts from Symbol 4. An agent that receives such a transaction knows that the request targets its sideband register space. Symbol 4's use as anything but the Command Data (or Response Data) depends on the CompIdxValid bit being set. This is a variant of an implicit addressing scheme which targets the Link Manager/Controller and is exploited to implement mandatory DTM transactions.

Note that an agent can also list the sideband register space as an accessible component in response to the GetComponentEnumeration command.

When an agent receives a request/command, it processes this request and sends a DTM response. A DTM response includes the following data symbols shown in Table 4.

TABLE 4

Table 4. DTM Response Data Symbols.

| Symbol | Bits | Name | Function |
| --- | --- | --- | --- |
| [1:0] | [15:0] | REG | 16-bit address of the register being read from or written to. |
| 2 | [6:0] | LEN | See table 5. Shall not exceed 122 bytes. |
| 2 | [7] | WnR | 1'b0 for a Read Response. 1'b1 for a Write Response. |
| 3 | [3:0] | SrcIndex | Zero-based index of the Responder, relative to the destination target. |
| 3 | [5:4] | Rsvd | Reserved. |
| 3 | [6] | CompIdx | Valid If set, the ComponentIdx field is valid. |
| 3 | [7] | EOM | Last payload. Indicates end of message payload. |
| 4 | [3:0] | ComponentIdx | Specifies the index of the component accessed. |
| 4 | [7:4] | Rsvd/MirrorCfg | Reserved/Mirror configuration. |
| [m:5] | 7:0 | Response_Data | For Read Responses, a sequence of bytes returned from the target. Contents appear least significant byte first. |

Valid payload responses in the Response_Data field do not exceed 122 Bytes. Note that this implies the total length of the response or command data symbols are less than or equal to 127 Bytes.

Table 5 below shows how a received DTM request is processed. This table is an extension of Table 4-14 in the USB4 Version 1.0 specification, with additions to support DTM responses. The new entries here include the Unsupported Transaction response (0xFFFF_FFFF) and a Wait-Duration response which specifies the time to wait (up to 4096 ms).

TABLE 5

Table 5. DTM Read Processing.

| STX Symbol Case | Action Taken | LEN Field in Response | Response_Data field |
| --- | --- | --- | --- |
| Read operation cases: | | | |
| Read operation to an invalid component register or an undefined register. | Send Response with unsupported transaction indication. Status register is updated as well. | 0 | UNSUPPORTED_TRANSACTION = 0xFFFF_FFFF |
| Read operation to a valid component that cannot be completed immediately. | Send Response with a wait duration in milliseconds in Response_Data. | 4 | Byte [1:0] = 0xF00F (WaitDuration) Byte [3:2] = Time in ms (<=4096 ms) |

TABLE 5-continued

Table 5. DTM Read Processing.

| STX Symbol Case | Action Taken | LEN Field in Response | Response_Data field |
|---|---|---|---|
| Read operation of more bytes than the target register length. | Send Response with a truncated read of the entire register contents. | Set to the size in bytes of the register(s) being accessed. | Register contents of register(s) being accessed. |
| Read operation of fewer bytes than the target register length. | Send Response with the number of bytes requested. | | Register contents of register(s) being accessed. |
| All other read operations. send the response. | Perform the operation and | | Register contents of register(s) being accessed. |

Table 6 below shows how DTM Writes are processed.

TABLE 6

Table 6. DTM Write Processing.

| STX Symbol Case | Action Taken | LEN Field in Response | Response_Data field |
|---|---|---|---|
| Write Operations: | | | |
| Write operation to an invalid component register or an undefined register. | Write is silently dropped. Status register is updated accordingly. | N/A | None. There are no responses to Write transactions. |
| Write operation to a valid component. | Write is performed to the register(s) and the Status register updated. | N/A | None. There are no responses to Write transactions. |

As mentioned previously, write transactions are posted transactions with no indication of success sent back. Instead, the Status Register (also referred to herein as a "debug status register") is updated to reflect the status of the recent action completed. Table 7 shows the Status Register format.

TABLE 7

Table 7. Status Register Format.

| Bits | Mode | Name | Function |
|---|---|---|---|
| [0] | RO | BUSY | An agent sets this bit to indicate processing of a received request. |
| [1] | RO | RdReq | Read request received. |
| [2] | RO | WrReq | Write request received. |
| [3] | RO | Rsvd | Reserved. |
| [4] | RW1C | WERR | A write error occurred. |
| [5] | RW1C | IERR | An internal error occurred. |
| [6] | RW1C | URR | Unsupported Request received. |
| [7] | RO | ERR | (WERR \| IERR \| URR \| ERR_CMP_IDX \| MIRROR_ERR). |
| [11:8] | RW1C | ERR_CMP_IDX | Component Index with a Component Access Error. |
| [15:12] | RO | Rsvd | Reserved. |
| [19:16] | RW | MIRROR_CFG | Request to set up mirroring as follows:<br>0 - No mirror.<br>1 - Display-In Configuration Writes and EDID data.<br>2 - Display-Out Configuration Writes and EDID data.<br>3 - I2C configuration transactions (where applicable).<br>4 - SBU TBT/USB4 UART traffic.<br>5 - 15: Reserved for future use. |
| [22:20] | RO | Rsvd | Reserved. |
| [23] | RW | DIRECTION | 1 - Upstream, 0 - Downstream. |
| [27:24] | RW1C | MIRROR_ERR | Mirror setup and/or execution errors from the sources specified in bits 16-19. |
| [31:28] | RW | SRC_INDEX | The source index of the requester. |

The Status register has some Read Only (RO) bits which are set and cleared by the agent and some Read/Write-1 to Clear (RW1C) bits, which are set by the agent but cleared by the debugger (e.g., software). The RW1C bits indicate errors that were encountered in the processing of a request and are cleared by writing a 1 to the respective bits.

The following is a quick overview of the Status register:

After a request is received by an agent, it sets the BUSY bit (Bit 0) and then proceeds to complete the request. Once the request is completed and the response is sent back to the DTS, the agent clears the BUSY bit. When bit 0 is set, the agent can drop any subsequent requests until the bit is cleared. The only exception to this rule is a read to the Status register, which must complete.

Bits 1 and 2 capture the last transaction received (either read or write). These bits are cleared when a new request is received from a DTS, except if the request is to read the Status register. This allows the debugger to confirm the last transaction received by the agent (TS).

Bit 4 indicates the last received write request was malformed (invalid component referenced or invalid register).

If bit 5 is set, an internal error occurred while processing the request. The internal error is limited to any faults during the reception and processing of the request.

If bit 6 is set, an unsupported request was received by the TS.

Bit 7 is a logical OR of all the error status bits. It will only be cleared when all the error status bits are cleared by the debugger.

Bits [15:8] reflect any errors encountered by the component specified in the ComponentIdx field of the Command Data Symbol. Any failure within these components (within the context of register accesses) is reflected here.

The remaining bits are control registers that the debugger uses to configure the TS to achieve a desired outcome. These are mainly used for setting up mirroring.

A debugger requests mirroring by configuring bits [19:16] e.g. Display-In and Display-Out adapters can use DTM to pass through both the configuration and received EDID payload from a connected display if the agent supports this feature and is appropriately configured to do so.

Bits [22:20] are reserved bits.

Bit 23 specifies the direction of the egress port for mirroring. An agent knows where to route the mirrored data (upstream/downstream) based on this bit and bits [31:28] (SrcIndex).

Bits [27:24] are error status bits from setup and/or execution of mirroring from the sources specified in bits [19:16] i.e. an SBU_MIRROR error is reflected in bit 27. An agent also indicates that it does not support mirroring for the requested source by setting the relevant bit here.

Bits [31:28] are the source index bits. A DTS/debugger will set these bits with the relative hop distance of the DTS from the TS. This is the same SrcIndex value as specified in the STX field of a DTM message.

The error status bits indicate that something went wrong but do not indicate the exact failure. A debugger can probe the failing component to get more details.

The Link Manager/Controller is implicitly addressed by specifying an address of zero and clearing the CompIdxValid in the Command Data Symbol. This allows to specify auxiliary requests which facilitate the base transport layer of DTM.

Table 8 is a list of required transactions. These are mandatory as they form the basis for the functionality DTM provides. They rely on the implicit addressing of the link controller/manager.

TABLE 8

Table 8. Mandatory Transactions.

| Transaction | Transaction ID | Description |
|---|---|---|
| GetID | 0x1 | Request for a unique target ID. |
| GetComponentEnumeration within a target. | 0x2 | Request table of components |
| GetStatusRegister | 0x3 | Request status register value. |
| GetDTMVersion version. | 0x4 | Request the DTM specification |

The GetID request is sent by a DTS to a TS to get a 16-byte unique identifier that allows the DTS (debugger) to distinguish the agents on the link. The type and format of the unique identifier is not defined explicitly but it is recommended that a unique digit sequence be returned. Note that since agents are addressed by a DTS using a hop-based offset scheme relative to the DTS, the unique identifier returned by GetID is not used to initiate requests. The purpose of this identifier is to confirm that the TS addressed by a DTS (by the SrcIndex) is in fact the intended agent.

If necessary, a debugger may create a topology of all the agents on the link with their respective unique identifiers before commencing any debug work.

The Data Symbol packet for this transaction is shown in Table 9 as follows:

TABLE 9

Table 9. GetID Data Symbol Packet format.

| Symbol | Bits | Name | Value |
|---|---|---|---|
| [1:0] | [15:0] | REG | 0x0 (-- Link Manager) |
| 2 | [6:0] | LEN | 0x10 |
| 2 | [7] | WnR | 1'b0 |
| 3 | [3:0] | SrcIndex | Zero-based index of the Sender. Used by the responding agent to specify the target of the response. |
| 3 | [5:4] | Rsvd | 2'b00 |
| 3 | [6] | CompIdxValid | 1'b0 (-- Link Manager) |
| 3 | [7] | EOM | 1'b1 (Optional) |
| 4 | [7:0] | Command | 0x1 (-- GetID request) |

The response for this request is given in Table 10 below.

TABLE 10

Table 10. GetID Response Packet format.

| Symbol | Bits | Name | Function |
|---|---|---|---|
| [1:0] | [15:0] | REG | 0x0 |
| 2 | [6:0] | LEN | 0x10 |
| 2 | [7] | WnR | 1'b0 |
| 3 | [3:0] | SrcIndex | Zero-based index of the Responder, relative to the destination target. |
| 3 | [5:4] | Rsvd | 2'b00 |
| 3 | [6] | CompIdxValid | 1'b0 |
| 3 | [7] | EOM | 1'b1 |
| [19:4] | [7:0] | Response_Data | 16-byte Unique ID |

The GetComponentEnumeration request is sent by a DTS to a TS to get a zero-based indexed list of components within the agent. The returned list includes at least one entry; the status register at index 0. The response format is not defined explicitly. However, it is recommended that a table of tuples composed of both an index and a name of the component be specified in the response. The component index in the response is the same index specified in the Command and Data Symbol so the debugger saves the response for future requests.

The response establishes a contract between the DTS and the TS which persists for the duration of the debugging session. The TS accepts a request to a component specified by an index derived from the list returned in response to this transaction. Based on a security policy, the TS can return a subset of the components within it, but any response includes at least one component; the status register at index 0.

The Data Symbol packet for this transaction is shown in Table 11 follows:

TABLE 11

Table 11. GetComponentEnumeration Data Symbol Packet format.

| Symbol | Bits | Name | Value |
|---|---|---|---|
| [1:0] | 15:0 | REG | 0x0 (-- Link Manager) |
| 2 | [6:0] | LEN | 0x0 (-- Can vary, up to TS how much to return) |
| 2 | [7] | WnR | 1'b0 |
| 3 | [3:0] | SrcIndex | Zero-based index of the Sender. Used by the responding agent to specify the target of the response. |
| 3 | [5:4] | Rsvd | 2'b00 |
| 3 | [6] | CompIdxValid | 1'b0 (-- Link Manager) |
| 3 | [7] | EOM | 1'b1 (Optional) |
| 4 | [7:0] | Command | 0x2 (-- GetComponentEnumeration request) |

Note that the LEN field is zero since the DTS has no knowledge of the table size the TS will return.

A sample response for this request is shown below in Table 12.

TABLE 12

Table 12. GetComponentEnumeration Sample Response.

| Symbol | Bits | Name | Function |
|---|---|---|---|
| [1:0] | [15:0] | REG | 0x0 |
| 2 | [6:0] | LEN | ?? (-- Agent dependent) |
| 2 | [7] | WnR | 1'b0 |
| 3 | [3:0] | SrcIndex | Zero-based index of the Responder, relative to the destination target. |
| 3 | [5:4] | Rsvd | 2'b00 |
| 3 | [6] | CompIdxValid | 1'b0 |
| 3 | [7] | EOM | 1'b1 |
| [m:4] | [7:0] | Response_Data | (Name, Index) tuple pair array of components. |

The GetStatusRegister request is sent by a DTS to a TS to read the Status register. The TS responds to this request and it does not fail. The Status register is instrumental in determining if Write transactions from a DTS were received and any errors that might have been encountered. Note that the status register can be accessed in two ways; as a component at index 0 or by reading the Link Manager status register. Reading the link manager status register may be useful for when a request does not complete e.g. GetComponentEnumeration.

The Data Symbol packet for this transaction is shown in Table 13 as follows:

TABLE 13

Table 13. GetStatusRegister Data Symbol Packet format.

| Symbol | Bits | Name | Value |
|---|---|---|---|
| [1:0] | 15:0 | REG | 0x0 (-- Link Manager) |
| 2 | [6:0] | LEN | 0x4 |
| 2 | [7] | WnR | 1'b0 |
|  | [3:0] | SrcIndex | Zero-based index of the Sender. Used by the responding agent to specify the target of the response. |
|  | [5:4] | Rsvd | 2'b00 |
| 3 | [6] | CompIdxValid | 1'b0 (-- Link Manager) |
| 3 | [7] | EOM | 1'b1 (Optional) |
| 4 | [7:0] | Command | 0x3 -- Status register |

Note that the Status register address is 0x0 and the CompIdxValid field is also 0x0.

The response for this request is shown below in Table 14.

TABLE 14

Table 14 GetStatusRegister Response format.

| Symbol | Bits | Name | Function |
|---|---|---|---|
| [1:0] | [15:0] | REG | 0x0 |
| 2 | [6:0] | LEN | 0x4 |
| 2 | [7] | WnR | 1'b0 |
| 3 | [3:0] | SrcIndex | Zero-based index of the Responder, relative to the destination target. |
| 3 | [5:4] | Rsvd | 2'b00 |
| 3 | [6] | CompIdxValid | 1'b0 |
| 3 | [7] | EOM | 1'b1 |
| [7:4] | [7:0] | Response_Data | Status Register contents. |

The Data Symbol packet for the status register as a component is shown in Table 15 below:

TABLE 15

Table 15. GetStatusRegister Data Symbol Packet format (as a component).

| Symbol | Bits | Name | Value |
|---|---|---|---|
| [1:0] | 15:0 | REG | 0x0 (-- Link Manager) |
| 2 | [6:0] | LEN | 0x4 |
| 2 | [7] | WnR | 1'b0 |
|  | [3:0] | SrcIndex | Zero-based index of the Sender. Used by the responding agent to specify the target of the response. |
| 3 | [5:4] | Rsvd | 2'b00 |
| 3 | [6] | CompIdxValid | 1'b1 (-- Valid component) |
| 3 | [7] | EOM | 1'b1 (Optional) |
| 4 | [3:0] | ComponentIdx | 0x0 (-- StatusRegister component) |
| 4 | [7:4] | Rsvd/MirrorCfg | 0x0 |

Since bit 6 of symbol 3 is set, the TS knows that a component index of 0 targets the status register component. Recall that the upper nibble of symbol 4 is unused for Write requests.

A response for the status register read as a component is shown in Table 16 below.

TABLE 16

Table 16. GetStatusRegister Component Response format.

| Symbol | Bits | Name | Function |
|---|---|---|---|
| [1:0] | [15:0] | REG | 0x0 |
| 2 | [6:0] | LEN | 0x4 |
| 2 | [7] | WnR | 1'b0 |

TABLE 16-continued

Table 16. GetStatusRegister Component Response format.

| Symbol | Bits | Name | Function |
|---|---|---|---|
| 3 | [3:0] | SrcIndex | Zero-based index of the Responder, relative to the destination target. |
| 3 | [5:4] | Rsvd | 2'b00 |
| 3 | [6] | CompIdxValid | 1'b1 |
| 3 | [7] | EOM | 1'b1 |
| 4 | [3:0] | ComponentIdx | 0x0 (-- StatusRegistercomponent) |
| 4 | [7:4] | Rsvd/MirrorCfg | 0x0 |
| [8:5] | [7:0] | Response_Data | Status Register contents. |

The GetDTMVersion request is sent by a DTS to a TS to read the version number to which the TS is adhering. An agent returns a 16-bit value which is formatted as follows: the upper 8-bits represent the major number while the lower 8-bits represent the minor version number. The current version of this specification specifies a value of 0x1:00 i.e., major version: 0x1 and minor version: 0x0.

The Data Symbol packet for this transaction is shown in Table 17 as follows:

TABLE 17

Table 17. GetDTMVersion Data Symbol Packet format.

| Symbol | Bits | Name | Value |
|---|---|---|---|
| [1:0] | 15:0 | REG | 0x0 (-- Link Manager) |
| 2 | [6:0] | LEN | 0x2 |
| 2 | [7] | WnR | 1'b0 |
| 3 | [3:0] | SrcIndex | Zero-based index of the Sender. Used by the responding agent to specify the target of the response. |
| 3 | [5:4] | Rsvd | 2'b00 |
| 3 | [6] | CompIdxValid | 1'b0 (-- Link Manager) |
| 3 | [7] | EOM | 1'b1 (Optional) |
| 4 | [7:0] | Command | 0x4 -- DTM Version number |

The response to such a read is shown in Table 18 below.

TABLE 18

Table 18. GetDTMVersion Response format.

| Symbol | Bits | Name | Function |
|---|---|---|---|
| [1:0] | [15:0] | REG | 0x0 |
| 2 | [6:0] | LEN | 0x2 |
| 2 | [7] | WnR | 1'b0 |
| 3 | [3:0] | SrcIndex | Zero-based index of the Responder, relative to the destination target. |
| 3 | [5:4] | Rsvd | 2'b00 |
| 3 | [6] | CompIdxValid | 1'b0 |
| 3 | [7] | EOM | 1'b1 |
| [7:4] | [7:0] | Response_Data | 0x100 |

A debugger can set up mirroring in an agent to get access to debug data (configuration or transaction data) directly. The mechanism through which mirroring is enabled is through the status register as covered in the status register section. An agent that supports mirroring will then form a DTM message and mirror the requested data on the sideband bus to the requestor (specified in the SrcIndex field of the status register) in the direction specified by the Direction field. The mirroring will persist until the debugger turns it off in the status register.

An agent can support one or more mirroring sources concurrently and there is no requirement to the number of concurrent channels an agent should support. Since the SrcIndex and Direction bits are read-writable (RW), there is a potential for a race condition in which more than one agent sets up mirroring in a TS. In practice, this is not an issue since there is only ever one debugger connected to a topology.

The response format for a mirror payload is given below in Table 19.

TABLE 19

Table 19. Mirror Configuration Packet format.

| Symbol | Bits | Name | Function |
|---|---|---|---|
| [1:0] | [15:0] | Mirror [1:0] | First 2 bytes of the mirrored data. |
| 2 | [6:0] | LEN | See table 5. Shall not exceed 122 bytes. |
| 2 | [7] | WnR | 1'b0 for a Read Response. |
| 3 | [3:0] | SrcIndex | Zero-based index of the Responder, relative to the destination target. |
| 3 | [5:4] | Rsvd | |
| 3 | [6] | CompIdxValid | 1'b1 (Component is valid). |
| 3 | [7] | EOM | Last payload. Indicates end of message payload. |
| 4 | [3:0] | ComponentIdx | 0x0 |
| 4 | [7:4] | MirrorCfg | The value written in MIRROR_CFG in the Status register. |
| [m:5] | 7:0 | Response_Data | Mirrored payload |

There are a few things worth noting from the response packet. The CompIdxValid bit is set. If this bit is not set, then the Response_Data field would start at symbol 4 instead. The ComponentIdx field is cleared (0x0) for mirrored responses. If this field is not cleared, then the DTS (debugger) would interpret this message as a response to a read from the component identified by the field. Similarly, for valid component access responses, the MirrorCfg field is cleared (0x0), to prevent a similar aliasing issue.

Mirroring is enabled to allow capturing data (configuration) in the sequence in which it occurs. For this reason, the format of the mirrored data embeds ordering metadata so that the debugger can determine the sequence of events in the response. This can be in the form of a timestamp or as basic as a monotonically increasing index count preceding each response.

Since DTM uses the same existing infrastructure as the other sideband traffic, there is a possibility of collision. The worst case is a lost transaction from the DTS. In DTM, if a response to a request has not been received within tReqCompletion, the DTS re-issues the request. In effect, collision is handled by re-sending the request if no response was received. This is also the default handling for when the Link Controller is internally busy and unable to respond to incoming requests.

The following Table 20 shows the DTM timing parameters.

TABLE 20

Table 20. DTM Timing Parameters.

| Parameter | Description | Min | Max | Units |
|---|---|---|---|---|
| tReqCompletion | Time duration between receiving a DTM request and sending a DTM response. | — | 1000 | ms |
| tWaitDuration | Time duration above tReqCompletion that a TS needs to respond to a request/command | — | 4096 | ms |

This table only adds relevant DTM timing parameters to the existing timing parameters for other types of sideband traffic. The full list of existing timing parameters is specified in Table 4-44 of the USB4 Version 1.0 specification.

Note that more elaborate and customized messages can be composed from what has been presented. An example of this is in implementing security features. For example, security features can be realized by taking advantage of the extensible nature of DTM. For example, every agent has a 16-byte ID that uniquely identifies it. An agent could embed this unique ID in the data field for write requests. The data can (optionally) be hashed or encrypted and sent over the same channel as is since DTM does not reference the data payload in routing responses. The TS (completer) can then reference this ID and decide the action to take based on the requester.

Embodiments having a standardized, readily available, and in-situ debug protocol may be leveraged by OEM's and device manufacturers, implementers, and semiconductor manufacturers as well. The cost savings are realized at every stage in the product design pipeline; OEM's do not need to populate boards with a debug connector (for blue-wiring in case of failures) and/or set aside expensive board space for these connector footprints. The purchase of expensive logic analyzers for debugging link or IP failures can be reduced or eliminated. Implementers (e.g. re-timer implementers) can easily debug their solutions in the development phase without expensive equipment. Factory failures can be debugged quickly and conveniently at the point of failure.

Figure 4:
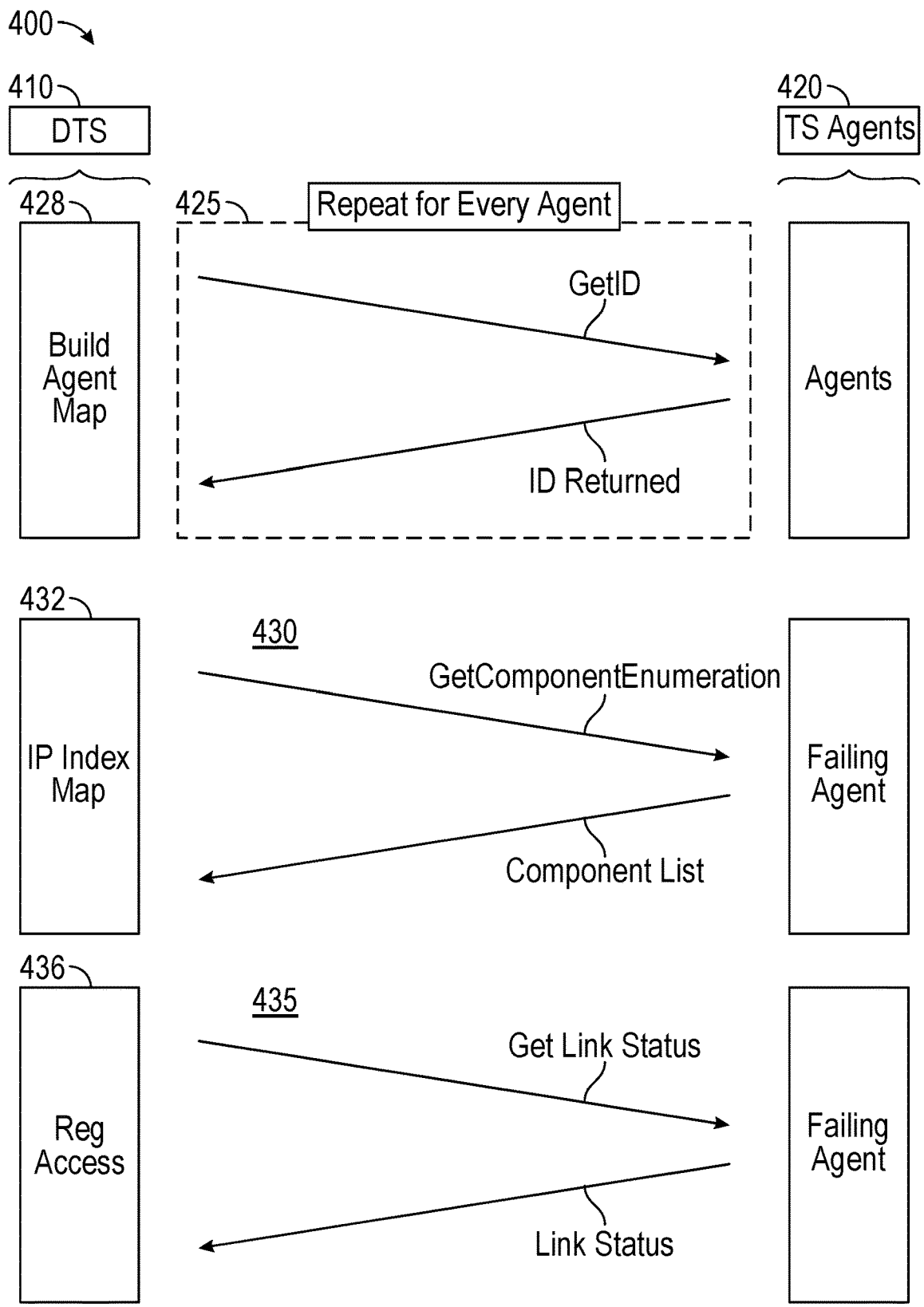
FIG. 4 is a flow diagram of a method in accordance with another embodiment.
Figure 4:
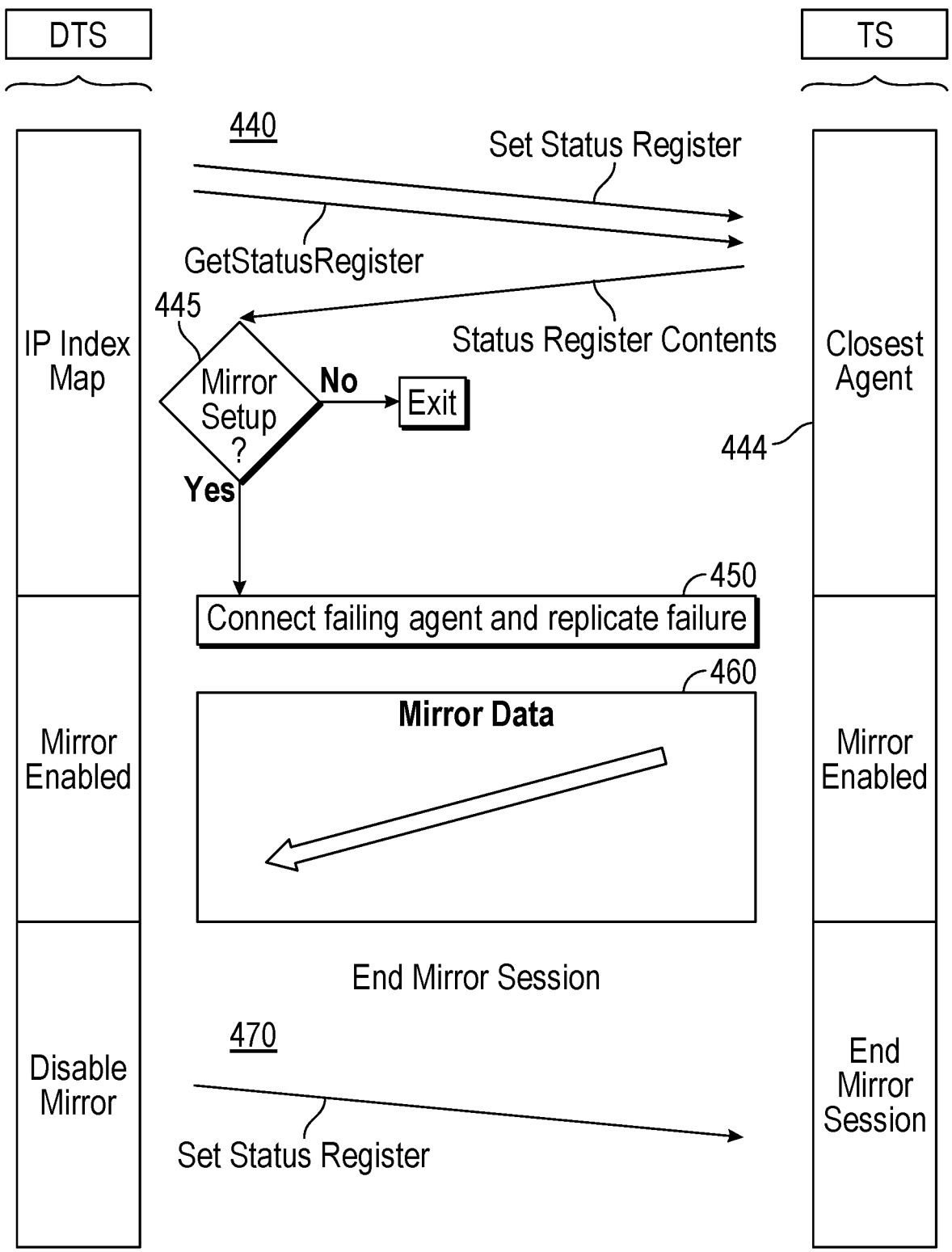

Referring now to FIG. 4, shown is a transaction flow of various DTM transactions that may occur between a debugger and a target agent in accordance with an embodiment. More specifically as shown in FIG. 4, a DTS 410 may be any device within a computing environment that can act as a debugger. As described herein, a variety of different devices may, with appropriate programming of software debug functionality implemented as instructions stored in a non-transitory storage medium, perform non-invasive in-situ debug operations. As shown, DTS 410 may be in communication with one or more target systems or agents 420.

Optionally, DTS 410 may issue a discovery command, namely a GetID command, to every agent present in a computing environment as shown at block 425. Each such agent, in response to this GetID command directed to it, may return an ID. From this information, DTS 410 may build an agent map 428, which it may store in a memory. With this information, DTS 410 may be able to communicate with particular agents using the DTM protocol as described herein, by directing requests to a given agent using the index-based identification technique described herein.

Still referring to FIG. 4, next at block 430, assume a given failing agent is identified. In this instance, DTS 410 may issue a component enumeration transaction to the failing agent to obtain a component list. From this information, DTS 410 may generate an IP index map 432 of the various components of the failing device. Next at block 435, assuming a link failure, DTS 410 may issue a link status request to the failing agent to obtain link status information according to a register access 436.

Still referring to FIG. 4, DTS 410 also may perform a mirroring process. To this end, at block 440 a mirroring configuration may be implemented by setting up mirroring in an agent closest to the failing agent (here closest agent 444), by writing appropriate information into a status register. As further shown, DTS 410 may next read the status register to ensure that its contents have been configured correctly. Based on this analysis it may be determined whether a mirroring configuration has been set up correctly (diamond 445). If not, no mirroring operation occurs. Otherwise mirroring is enabled.

At block 450, the failing agent may be reconnected. For example, in the case of a failing display, the display may be relinked to a given device (namely, the closest agent). At this point, various configuration information may be communicated between the display and this closest agent to replicate the failure. These communications, which may occur on a sideband path between the closest agent and the display, can be mirrored such that mirror data 460 is communicated back to DTS 410. At the conclusion of this operation the mirror session may be terminated at block 470, e.g., by updating the status register appropriately. Understand that DTS 410 and/or a user may consume the received mirror data in order to identify or debug the occurring fault. Understand while shown at this high level in the embodiment of FIG. 4, many variations and alternatives are possible.

The following examples are used to show DTM mirroring and debug use cases.

A DTS can set up mirroring in a TS by writing to the status register using the implicit addressing scheme described above. A debugger can set up mirroring to capture the sideband packets (SBU packets) between an agent and its link partner. Considering the case of FIG. 1A above, assume the host router is the DTS and the agent is the TS. In this scenario, to capture the traffic on the SBU lines between the re-timer on the host and Device A, the debugger sets up mirroring in the re-timer with the direction bit set to 1 (Upstream) and the SrcIndex field set to 0x0 (one hop away from Router). The status register payload is thus 0x840000h. This value corresponds to the following fields set: bit 23: =0x1—Direction Upstream); and bit [19:16]=0x4-SBU Mirroring Enable.

The Data Symbol packet for this transaction is shown in Table 21 below:

TABLE 21

Table 21. SBU Mirror Request Data Symbol

| Symbol | Bits | Name | Value |
|---|---|---|---|
| [1:0] | 15:0 | REG | 0x0 (-- Link Manager) |
| 2 | [6:0] | LEN | 0x4 |
| 2 | [7] | WnR | 1'b1 (Write) |
| 3 | [3:0] | SrcIndex | 4'b0 (-- 1 hop away from Router A) |
| 3 | [5:4] | Rsvd | 2'b00 |
| 3 | [6] | CompIdxValid | 1'b0 (-- Link Manager) |
| 3 | [7] | EOM | 1'b1 (Optional) |
| 4 | [7:0] | Command | 0x840000 |

After a successful configuration, a read of the status register from the re-timer should show bits 18 and 23 set. Device A can then be connected and the SBU traffic can be captured by the debugger for errors. This eliminates any expensive equipment that is currently used to capture SBU traffic currently.

Mirroring can be setup for other IP's the agent supports as reflected in the status register. The same process of configuration is done, followed by a read of the status register to confirm mirroring is set up correctly before the failure replication begins.

DTM can be used to debug both link and IP/Component failures. A typical debug flow entails the following steps: debugger (DTS) issues a GetID of the agents in the topology to build a map of all agents (optional); debugger (DTS) requests a component enumeration in the failing agent using GetComponentEnumeration transaction; and armed with the component list, a debugger can target the failing component's register(s) and/or set up mirroring if applicable.

With reference back to FIG. 1A in which the main link between the host (DTS) and Device A is non-functional. Assume the host router is the DTS and the agent is the TS. With DTM, Device A's registers can be read to understand the reason for the failure. It is assumed that a component enumeration step is completed, and the component map has been returned with the appropriate component indices.

For this case, since the link is the failure, Device A's link controller can be targeted as a component and the relevant registers are read. Assume the link controller component index is 0x1 and the link status register offset is 0x1234.

The Data Symbol packet for this transaction is as follows in Table 22:

TABLE 22

Table 22. Link Status Register Data Symbol Packet.

| Symbol | Bits | Name | Value |
|---|---|---|---|
| [1:0] | 15:0 | REG | 0x1234 (Link Status Register offset) |
| 2 | [6:0] | LEN | 0x4 |
| 2 | [7] | WnR | 1'b0 |
| 3 | [3:0] | SrcIndex | 1'b1 |
| 3 | [5:4] | Rsvd | 2'b00 |
| 3 | [6] | CompIdxValid | 1'b1 (-- Valid component) |
| 3 | [7] | EOM | 1'b1 (Optional) |
| 4 | [3:0] | ComponentIdx | 0x1 |
| 4 | [7:4] | Rsvd/MirrorCfg | 0x0 |

Recall that the component list returned by the TS specifies both a component identifier (name) and a unique index with which the DTS can reference the component. With the component list in place, the DTS can access the various component's register spaces. Below is the flow for configuring and using mirroring for debug.

A DTS may first setup mirroring in the agent closest to the failing agent by writing the status register. The DTS then reads the status register to ensure that mirroring has been configured correctly (bits 16-19 are set AND no errors shown in bits 24-27). If mirroring is set up correctly, the failing agent can be connected, and the error replicated. The configured agent will then send the mirrored data back to the DTS. The DTS ends the mirror session by writing to the status register.

DTM can be used to debug a failing component, such as in FIG. 10. As shown, the display component in device B is not functional. No output is seen on the monitor upon connection. While the registers in Device B can be read using DTM, embodiments may further be used to see the entire configuration process that happens after the monitor is connected.

After a display is attached, the Hot Plug Detect (HPD) pin is asserted which alerts the source (Host) of the sink (the display) attachment. After this is a series of configuration requests between the Source and the Sink on the Auxiliary Channel (AUX Channel) that include the Extended Display Identification Data (EDID) and other topology information.

To see this information, Device B is configured to enable mirroring of Display Auxiliary packets (Display Out and Display In mirroring). The debugger sets up mirroring with the direction bit set to 1 (Upstream) and the SrcIndex field set to 0x2 (3 hops away from Device B).

The status register payload is thus 0x830000h. This value corresponds to the following fields set: bit [23]=0x1—Direction Upstream; and bit [19:16]=0x3-Display-In and Display-Out Configuration Write Mirroring Enable.

The Data Symbol packet for this transaction is shown in Table 23 below:

TABLE 23

Table 23. Mirror Configuration Data Symbol Packet.

| Symbol | Bits | Name | Value |
|---|---|---|---|
| [1:0] | 15:0 | REG | 0x0 -- Link Manager |
| 2 | [6:0] | LEN | 0x4 |
| 2 | [7] | WnR | 1'b1 (Write) |
| 3 | [3:0] | SrcIndex | 4'b0 (-- 1 hop away from Router A) |
| 3 | [5:4] | Rsvd | 2'b00 |
| 3 | [6] | CompIdxValid | 1'b0 (-- Link Manager) |
| 3 | [7] | EOM | 1'b1 (Optional) |
| 4 | [7:0] | Command | 0x830000 |

After a successful configuration, a read of the status register from Device B shows bits 16, 17 and 23 set. The monitor can then be connected, and display configuration traffic including EDID data can be captured by the debugger for decoding and error inspection. This eliminates any expensive equipment that is currently used to capture and decode display AUX traffic currently.

Figure 5:
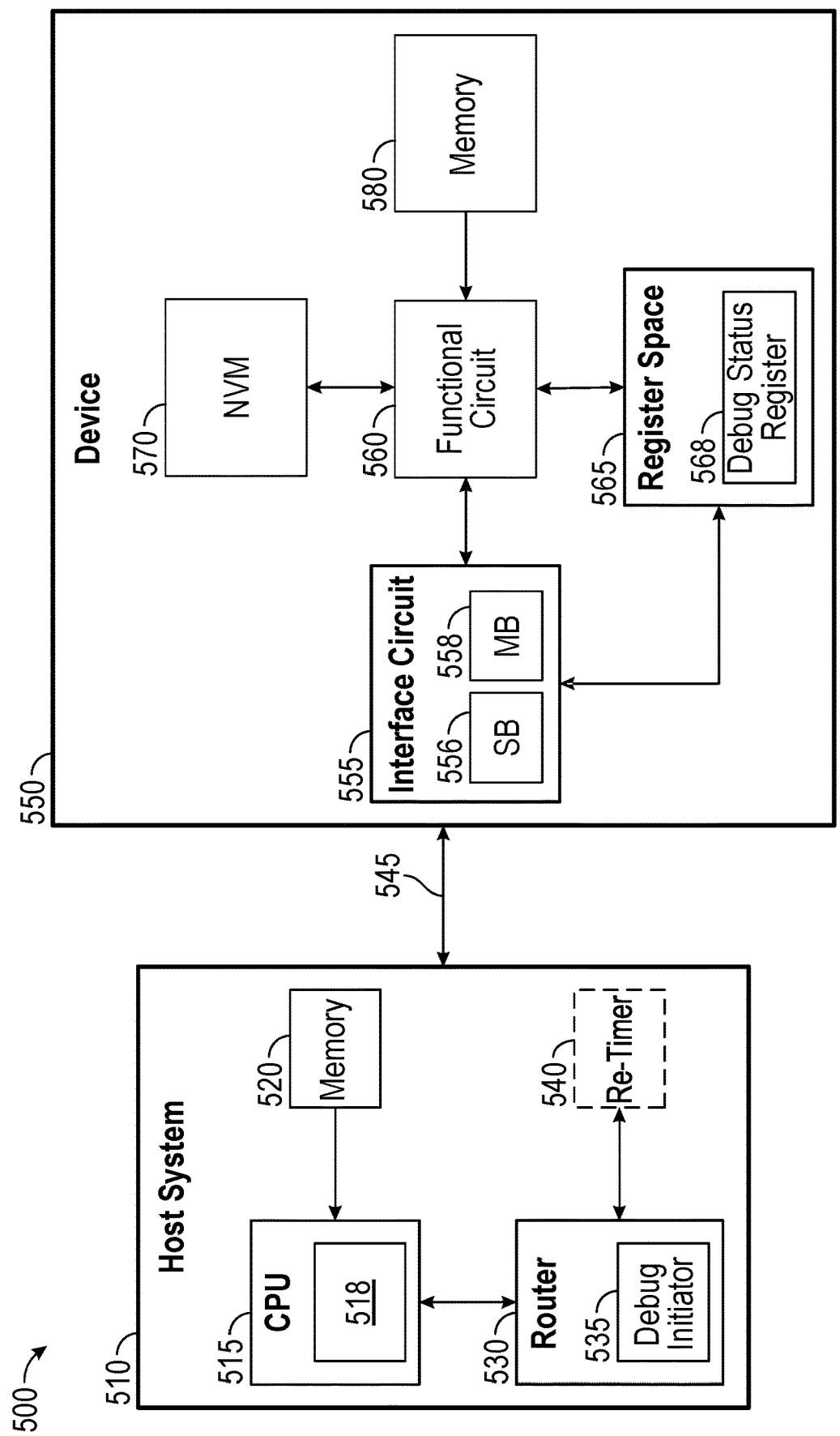
FIG. 5 is a block diagram of a system in accordance with another embodiment.

Referring now to FIG. 5, shown is a block diagram of a system in accordance with another embodiment. As shown in FIG. 5, system 500 may be any type of computing system. For example, system 500 may be a personal computer such as a laptop computer having a device coupled to it via a serial link. As shown, a host system 510 (e.g., the personal computer) has a CPU 515 on which a debug agent 518 may execute. In an embodiment, debug agent 518 while in execution on CPU 515 may be stored in a memory 520.

As further shown, CPU 515 couples to a router 530 which may be a router for a serial link and may include circuitry for both main band and sideband paths as described herein. Router 530 may include a debug initiator 535 which, in response to a request for a debug operation, may initiate a DTM request via the sideband path. As shown, this request may pass through an optional re-timer 540 and via a serial link 545 (more specifically, a sideband path of link 545) to a device 550.

In different examples, device 550 may include any type of functionality and can be implemented as a standalone device that may couple via the serial link. As shown, device 550 includes an interface circuit 555 having a sideband circuit 556 and a main band circuit 558. Incoming DTM communications may be handled via sideband circuit 556 and can be provided to a functional circuit 560, which may be one of multiple components present within device 550 to perform a given function. As examples, the functional circuit may be some type of accelerator, display device or so forth. Functional circuit 560 couples to a register space 565. In some cases register space 565 may be a component register space internal to functional circuit 560. As further shown, a debug status register 568 maintains debug status information as described herein is present. Although shown within register space 565, understand that this debug status register may be differently located in other embodiments.

Still with reference to FIG. 5, functional circuit 560 is in communication with a non-volatile memory (NVM) 570 and a memory 580. In some cases, device 550 itself may act as a DTS or debug initiator via software and/or firmware stored in NVM 570 and/or memory 580 that may execute on functional circuit 560. Thus with embodiments, non-invasive debugging may occur using a DTM protocol as described herein.

The following examples pertain to further embodiments.

In one example, a method comprises: in response to identifying an error in a device of a computing environment coupled to a host system of the computing environment via a serial link, sending, from a requester, a DTM request towards the device via a sideband portion of the serial link, the requester in-situ to the computing environment; and receiving, in the requester, a DTM response to the DTM request, the DTM response including status information of the device, via the sideband portion of the serial link.

In an example, the method further comprises sending the DTM request and receiving the DTM response non-invasively to the computing environment.

In an example, the method further comprises sending the DTM request from the requester comprising a re-timer coupled between the host system and the device. In an example, the method further comprises receiving the DTM response including status information comprising register space information of at least one component of the device.

In an example, sending the DTM request comprises sending the DTM request to another device coupled between the requester and the device, the DTM request having an index field with a non-zero value.

In an example, the method further comprises: in the another device, identifying the non-zero value; decrementing the non-zero value; and sending the DTM request having the decremented value towards the device.

In an example, the method further comprises: in the device, identifying a zero value in the index field; and processing the request as a target in response to the zero value.

In an example, the method further comprises: initiating, by the requester, a mirror session within the device; receiving, in the requester, during the mirror session, mirror data comprising sideband communications between the device and a failing agent connected to the device; and consuming the mirror data to debug the error.

In another example, a computer readable medium including instructions is to perform the method of any of the above examples.

In a further example, a computer readable medium including data is to be used by at least one machine to fabricate at least one integrated circuit to perform the method of any one of the above examples.

In a still further example, an apparatus comprises means for performing the method of any one of the above examples.

In another example, a device comprises: a serial interface to communicate via a serial link having a primary path and a sideband path; a functional circuit to perform at least one function; and a debug status register to store status information regarding non-invasive debug of the device according to a DTM protocol for the serial link.

In an example, in response to a DTM read request received via the sideband path from a non-invasive debug initiator, the device is to send at least a portion of the status information from the debug status register to the non-invasive debug initiator.

In an example, in a first mode the device is to be another non-invasive debug initiator via the sideband path, and in a second mode the device is to be a responder to the non-invasive debug initiator via the sideband path.

In an example, the device comprises at least one non-transitory storage medium having instructions stored thereon, which in the first mode, the device is to execute to cause the device to be the non-invasive debug initiator. In an example, in response to a DTM component enumeration request, the device is to provide a configuration list to the non-invasive debug initiator, the component list to identify at least some components of the device.

In an example, in response to a DTM mirror request, the device is to perform sideband communications with another device and provide mirror data comprising at least a portion of the sideband communications to the non-invasive debug initiator.

In an example, the device further comprises a register to store a version value to indicate a version of the DTM protocol for which the device is configured.

In an example, in response to another DTM request having an index field with a non-zero value, the device is to send the DTM request to another device coupled to the device via the sideband path. In an example, the device is to decrement the non-zero value of the index field and then send the DTM request to the another device.

In another example, a system comprises a host system and a first device coupled to the host system via a serial link. The host system may include: a CPU; a router coupled to the CPU, the router to communicate with a first device via a serial link having a main path and a sideband path; and a non-invasive debugger to initiate an in-situ non-invasive debug operation. The first device may include at least one component having at least one component register space. The host system may: send a DTM request towards the first device via the sideband path to obtain status information from the at least one component register space of the at least one component of the first device; and receive a DTM response to the DTM request, the DTM response including the status information, via the sideband path.

In an example, the host system further comprises a re-timer, wherein the re-timer comprises the non-invasive debugger.

In an example, when the first device is directly connected to the host system via the serial link, the host system is to send the DTM request having an index field having a zero value towards the first device, and when the first device is indirectly connected to the host system, the host system is to send the DTM request having an index field having a non-zero value towards the first device, and one or more intervening devices are to decrement the non-zero value.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. A method comprising:
   in response to identifying an error in a device of a computing environment coupled to a host system of the computing environment via a serial link, sending, from a requester, a debug type messaging (DTM) request towards the device via a sideband portion of the serial link, the requester in-situ to the computing environment, wherein sending the DTM request comprises sending the DTM request to another device coupled between the requester and the device, the DTM request having an index field with a non-zero value; and
   receiving, in the requester, a DTM response to the DTM request, the DTM response including status information of the device, via the sideband portion of the serial link.

2. The method of claim 1, further comprising sending the DTM request and receiving the DTM response non-invasively to the computing environment.

3. The method of claim 1, further comprising sending the DTM request from the requester comprising a re-timer coupled between the host system and the device.

4. The method of claim 1, further comprising receiving the DTM response including status information comprising register space information of at least one component of the device.

5. The method of claim 1, further comprising:
   in the another device, identifying the non-zero value;
   decrementing the non-zero value; and
   sending the DTM request having the decremented value towards the device.

6. The method of claim 5, further comprising:
   in the device, identifying a zero value in the index field; and
   processing the request as a target in response to the zero value.

7. The method of claim 1, further comprising:
   initiating, by the requester, a mirror session within the device;
   receiving, in the requester, during the mirror session, mirror data comprising sideband communications between the device and a failing agent connected to the device; and
   consuming the mirror data to debug the error.

8. A device comprising:
   a serial interface to communicate via a serial link having a primary path and a sideband path;
   a functional circuit to perform at least one function; and
   a debug status register to store status information regarding non-invasive debug of the device according to a debug type messaging (DTM) protocol for the serial link, wherein in response to a DTM component enumeration request, the device is to provide a configuration list to the non-invasive debug initiator, the component list to identify at least some components of the device.

9. The device of claim 8, wherein in response to a DTM read request received via the sideband path from a non-invasive debug initiator, the device is to send at least a portion of the status information from the debug status register to the non-invasive debug initiator.

10. The device of claim 9, wherein in a first mode the device is to be another non-invasive debug initiator via the sideband path, and in a second mode the device is to be a responder to the non-invasive debug initiator via the sideband path.

11. The device of claim 10, wherein the device comprises at least one non-transitory storage medium having instructions stored thereon, which in the first mode, the device is to execute to cause the device to be the non-invasive debug initiator.

12. The device of claim 8, wherein in response to a DTM mirror request, the device is to perform sideband communications with another device and provide mirror data comprising at least a portion of the sideband communications to the non-invasive debug initiator.

13. The device of claim 8, further comprising a register to store a version value to indicate a version of the DTM protocol for which the device is configured.

14. The device of claim 8, wherein in response to another DTM request having an index field with a non-zero value, the device is to send the DTM request to another device coupled to the device via the sideband path.

15. The device of claim 14, wherein the device is to decrement the non-zero value of the index field and then send the DTM request to the another device.

16. A system comprising:
   a host system comprising:
      a central processing unit (CPU);
      a router coupled to the CPU, the router to communicate with a first device via a serial link having a main path and a sideband path; and
      a non-invasive debugger to initiate an in-situ non-invasive debug operation; and the first device coupled to the host system via the serial link, the first device comprising at least one component having at least one component register space, wherein the host system is to: send a debug type messaging (DTM) request towards the first device via the sideband path to obtain status information from the at least one component register space of the at least one component of the first device, wherein when the first device is directly connected to the host system via the serial link, the host system is to send the DTM request having an index field having a zero value towards the first device, and when the first device is indirectly connected to the host system, the host system is to send the DTM request having an index field having a non-zero value towards the first device, and one or more intervening devices are to decrement the non-zero value; and receive a DTM response to the DTM request, the DTM response including the status information, via the sideband path.

17. The system of claim 16, wherein the host system further comprises a re-timer, wherein the re-timer comprises the non-invasive debugger.

* * * * *